(12) United States Patent
Kuebelbeck et al.

(10) Patent No.: US 8,088,297 B2
(45) Date of Patent: *Jan. 3, 2012

(54) COMBINED ETCHING AND DOPING MEDIA FOR SILICON DIOXIDE LAYERS AND UNDERLYING SILICON

(75) Inventors: Armin Kuebelbeck, Bensheim (DE); Werner Stockum, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 774 days.

This patent is subject to a terminal disclaimer.

(21) Appl. No.: 11/995,449

(22) PCT Filed: Jun. 13, 2006

(86) PCT No.: PCT/EP2006/005628
§ 371 (c)(1),
(2), (4) Date: Jan. 11, 2008

(87) PCT Pub. No.: WO2007/006381
PCT Pub. Date: Jan. 18, 2007

(65) Prior Publication Data
US 2008/0210298 A1    Sep. 4, 2008

(30) Foreign Application Priority Data
Jul. 12, 2005  (DE) .......................... 10 2005 032 807

(51) Int. Cl.
*B44C 1/22* (2006.01)
*C23F 1/00* (2006.01)

(52) U.S. Cl. ................ 216/79; 216/24; 216/83; 216/74; 216/80

(58) Field of Classification Search ............... 216/83, 216/74, 79, 80
See application file for complete search history.

(56) References Cited

U.S. PATENT DOCUMENTS

| | | | |
|---|---|---|---|
| 4,921,626 A | 5/1990 | Rhodenbaugh | |
| 6,232,207 B1 * | 5/2001 | Schindler | 438/562 |
| 7,629,257 B2 * | 12/2009 | Klein et al. | 438/689 |
| 7,824,563 B2 * | 11/2010 | Stockum et al. | 216/83 |
| 2003/0121884 A1 | 7/2003 | Li et al. | |
| 2003/0160026 A1 | 8/2003 | Klein et al. | |
| 2004/0242019 A1 | 12/2004 | Klein et al. | |
| 2009/0071540 A1 * | 3/2009 | Klein et al. | 136/261 |

FOREIGN PATENT DOCUMENTS

WO   WO 01/83391 A1   11/2001
WO   WO 03/034504 A1   4/2003

* cited by examiner

*Primary Examiner* — Shamim Ahmed
(74) *Attorney, Agent, or Firm* — Millen, White, Zelano, Branigan, P.C.

(57) ABSTRACT

The present invention relates firstly to HF/fluoride-free etching and doping media which are suitable both for the etching of silicon dioxide layers and also for the doping of underlying silicon layers. The present invention also relates secondly to a process in which these media are employed.

12 Claims, 1 Drawing Sheet

COMBINED ETCHING AND DOPING MEDIA FOR SILICON DIOXIDE LAYERS AND UNDERLYING SILICON

The present invention relates firstly to HF/fluoride-free etching and doping media which are suitable both for the etching of silicon dioxide layers and also for the doping of underlying silicon layers. The present invention also relates secondly to a process in which these media are employed.

PRIOR ART AND OBJECT OF THE INVENTION

The term "solar cell" below is defined as mono- and polycrystalline silicon solar cells, independently of solar cell types based on other materials.

The mode of action of a solar cell is based on the photoelectric effect, i.e. on the conversion of photon energy into electrical energy.

For silicon solar cells, pre-doped silicon base material (usually p-doped Si) is to this end doped with opposite charge carriers with a different name (for example phosphorus doping results in $n^+$ conduction), i.e. a p-n junction is produced.

On input of photon energy into the solar cell (sunlight), charge carriers are formed at this p-n junction, which results in a broadening of the space-charge region and in an increase in voltage. The voltage is tapped by providing the solar cell with contacts, and the solar current is conducted to the consumer.

The typical process sequence for the production of solar cells consists in simplified terms in:
1. structuring of the front side of the p-doped Si sheet
2. $n^+$ doping (usually with phosphorus)
3. etching of the PSG (phosphosilicate glass)
4. passivation/antireflection coating with silicon oxide or silicon nitride layers
5. metallisation of the front and back For further consideration of the invention, a more detailed description of step 4 is necessary.

In some earlier production processes, the passivation layer is achieved via the formation of a thermally generated $SiO_2$ layer [1]. The way of functioning consists in that the majority of the unsaturated bonds on the Si surface are saturated and rendered inactive there. The flaw density and recombination rate are thus reduced. By setting the $SiO_2$ layer thickness to about 100 nm (=λ/4 rule), a reflection-reducing surface is additionally produced.

The literature furthermore discloses the coating with $TiO_2$ layers, which, although only exhibiting a small passivation effect, can, however, make a significant contribution to reflection reduction of a solar cell owing to the higher refractive index [2].

For the production of highly efficient solar cells, the use, in particular, of silicon nitride layers as passivation layer has proven particularly advantageous in practice. The excellent passivation properties are known from semiconductor technology, for example as barrier or passivation layers in integrated circuits, FETs, capacitors, etc.

In accordance with the current state of the art, the coating of a mono- or polycrystalline solar cell with silicon nitride represents the best process for surface passivation and reflection reduction. It is in the meantime being employed in mass production in more recent production lines.

In order to increase the efficiency, it has proven advantageous in laboratory experiments to dope the regions under the contacts on the emitter side to a greater extent than the surrounded $n^+$ region, i.e. to carry out $n^{++}$ diffusion with phosphorus. These structures are known as selective or two-stage emitters [7]. The doping in the $n^+$ region is in an order of magnitude of $10^{18}$ cm$^{-3}$ and that in the $n^{++}$ region is in the region of about $10^{20}$ cm$^{-3}$. Efficiencies of up to 24% are achieved on a laboratory scale with highly efficient solar cells of this type.

In order to obtain these regions which are doped to different extents for the selective emitter, a number of processes are described in the literature, all based on a structuring step. Openings are produced in a targeted manner here, usually through the use of photolithographic methods, in $SiO_2$ layers—which prevent doping of the underlying silicon in the vapour phase—facilitating local doping. This doping is usually carried out in the gas phase with $POCl_3$ or $PH_3$. The doping windows are usually etched into the silicon dioxide using hydrofluoric acid or buffered hydrofluoric acid.

Owing to the very complex and expensive procedure, these processes have not been implemented beyond the laboratory stage.

Another process is based on the removal of the $n^{++}$ regions by etching with an etching mixture comprising hydrofluoric acid and nitric acid, with simultaneous masking of the later contact regions. This process has likewise not been able to establish itself in practice owing to its complex procedure.

A common feature of all these processes is that the passivation layer has to be opened locally using hydrofluoric acid or salts of hydrofluoric acid. In addition, doping must take place in the gas phase after a rinsing and drying step.

Local opening of the $SiO_2$ or silicon nitride layer with the aid of an etching paste, as described in DE 10101926.2 or PCT/EP 01/03317, and subsequent doping in the gas phase with, for example, $POCl_3$, appear to be clearly superior to these processes.

DE 101 50 040 A1 describes a combined etching and doping medium which is able to etch silicon nitride layers and, in a subsequent optional step, to dope silicon under the silicon nitride in the areas etched away.

In the so-called LOCOS process known in semiconductor technology, in which silicon nitride is selectively etched at temperatures in the range 150-180° C. using hot phosphoric acid in the presence of silicon dioxide, the etch rates for silicon dioxide are significantly below 1 nm/min. W. van Gelder and V. E. Hauser describe this situation quite clearly in the form of a diagram ["The etching of Silicon Nitride in Phosphoric Acid with Silicon Dioxide as a Mask", J. Electrochem. S., 114(8), 869 (1967)]:

Evaluation of this diagram shows that, through extrapolation of the lines drawn in the diagram, which represent the etch rates of silicon nitride and silicon dioxide, at a temperature of about 270° C., the etch rate of silicon dioxide (intersection of the extrapolated lines) should be the same as that of silicon nitride.

In practical use, it has hitherto not been possible, even at a temperature of 300° C., to achieve a sufficiently high etch rate of silicon dioxide layers by means of which the use of etching media based on phosphoric acid or salts thereof for, for example, photovoltaic applications appears useful. By contrast, silicon nitride layers having a thickness of 70 nm produced by means of PE-CVD methods can be etched completely within less than 60 seconds using the same etching medium at 300° C.

The object of the present invention is therefore to provide a suitable etching medium with the aid of which silicon dioxide layers of solar cells can be etched selectively at high etch rates. A further object of the present invention is therefore to provide a process for the selective etching of silicon dioxide layers for the production of selective emitter structures in solar cells which, besides the etching, also facilitates targeted phosphorus doping in order to produce $n^{++}$ regions.

DESCRIPTION OF THE INVENTION

Figure 1:
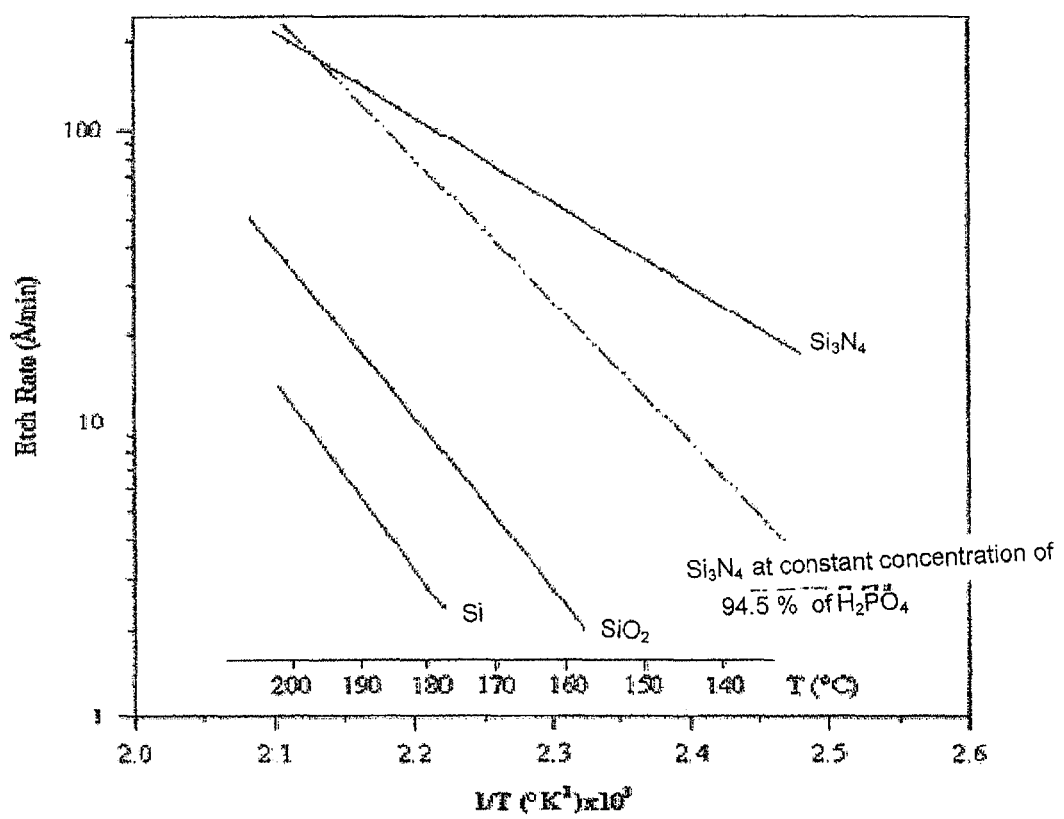
FIG. 1 depicts the etch rates of silicon, silicon dioxide, and silicon nitride in phosphoric acid.

The object according to the invention is achieved by a process for the etching of passivation and antireflection layers of silicon dioxide on solar cells according to Claims 1 and 2 and its particular embodiment according to Claims 3 to 7. This process is carried out by means of an etching medium comprising phosphoric acid or salts thereof, which is applied in a single process step over the entire surface or selectively to the surface regions to be etched and is activated by the action of heat. The present invention thus also relates to the silicon surfaces treated by this process and to the solar cells produced.

The object according to the invention is achieved, in particular, by means of an etching medium in which the various forms of phosphoric acid or suitable phosphoric acid salts or compounds which decompose to the corresponding phosphoric acid on heating serve as etching and optionally as doping component.

DETAILED DESCRIPTION OF THE INVENTION

The present invention relates to a process for the etching of passivation and antireflection layers of silicon dioxide on solar cells in which an etching medium comprising phosphoric acid or salts thereof is applied in a single process step over the entire surface or selectively to the surface regions to be etched. In the process according to the invention, the silicon substrate provided with etching medium is heated over the entire surface or locally to temperatures in the range from 350 to 400° C. for 30 to 120 seconds, and optionally, for additional $n^{++}$ doping, subsequently heated to temperatures >800° C. for 1 to 60 minutes. It has been found that heating to temperatures in the range from 800 to 1050° C. gives good doping results. Printable, paste-form etching media are particularly suitable for carrying out the process according to the invention. The etching medium used can be applied by spraying, spin-coating, dipping or by screen, stencil, stamp, pad or ink-jet printing, depending on the consistency. The subsequent heating can be carried out on a hotplate, in a convection oven, by IR radiation, UV radiation or microwaves. Local heating can be carried out using a laser, in particular an IR laser for heating to temperatures >800° C. In accordance with the invention, the claimed process can serve for the production of solar cells with two-stage emitters.

The present invention relates, in particular, to an etching medium for the etching of inorganic passivation and antireflection layers on solar cells which comprises the various forms of phosphoric acid or suitable phosphoric acid salts or compounds which decompose to the corresponding phosphoric acids on heating and serve as etching or doping components in the process.

As active components, these can be ortho-, meta- or pyro-phosphoric acid, and/or meta-phosphorus pentoxide, or mixtures thereof, which act both as etching and doping component. The etching medium used can also be an etching paste comprising one or more ammonium salt(s) of phosphoric acid and/or mono- or diesters of a phosphoric acid which liberate the etching phosphoric acid through input of thermal energy.

Furthermore, the etching medium according to the invention in paste form comprises at least one etching and doping component, solvents, thickeners and optionally additives, such as antifoams, thixotropic agents, flow-control agents, deaerators and adhesion promoters. Etching media of corresponding composition are particularly suitable for the $n^{++}$ doping of silicon and can be used for the production of solar cells with two-stage emitters and can advantageously be employed in the process characterised above. Accordingly, the present invention also relates to solar cells produced in a process of this type using an etching medium according to the invention.

Whereas phosphoric acids per se and/or salts thereof have not proven suitable as etching components for silicon dioxide layers under the etching conditions usually used, it has now been found, surprisingly, through experiments that ortho-phosphoric acid, meta-phosphoric acid, pyro-phosphoric acid or salts thereof and here in particular the ammonium salts, selected from the group $(NH_4)_2HPO_4$ and $NH_4H_2PO_4$, and other compounds which form one of these compounds on thermal decomposition are able to etch and completely remove silicon dioxide layers having a layer thickness of 120 nm at a sufficiently high etch rate at temperatures above 350° C.

In addition, local etching can be carried out by selective application, such as, for example, screen printing, ink-jet processes or other processes, and heating of the coated silicon substrate over the entire surface. The same can be achieved by complete coating, such as, for example, by spin-coating, spray coating or other methods, followed by local heating, such as, for example, by heating using an IR laser.

The classical wet-chemical methods for etching silicon dioxide are based on aqueous hydrofluoric acid or aqueous buffered hydrofluoric acid, for example $NH_4HF_2$ or $KHF_2$ solutions. The materials have high toxicity. In addition, the volatile and likewise fairly toxic gas $SiF_4$ is formed during the etching of silicon dioxide.

By contrast, phosphoric acid and salts thereof, in particular ammonium dihydrogenphosphate $NH_4H_2PO_4$ and diammonium hydrogenphosphate $(NH_4)_2HPO_4$, are substantially toxicologically and ecologically acceptable. A particular advantage of this etching process therefore consists in that the silicon dioxide can be etched without the use of hydrofluoric acid or hydrofluoric acid salts which are toxic and expensive to dispose of. In addition, the beginning and end of the etching can be controlled simply through the time and duration of the thermal excitation. A particular advantage is that, by means of a selectively printed-on phosphoric acid (ortho-, meta- or pyro-), or one of its salts or compounds, the same can be liberated, for example by thermal excitation, and an $n^{++}$ doping, as is necessary in the case of the selective emitter, can be produced in a second, immediately subsequent process step. This doping process is known to the person skilled in the art and can be carried out, for example, as described in [7].

The invention therefore relates to the production of selective emitter structures through the use of combined HF/fluoride-free, printable etching and doping media.

The etching media used are HF/fluoride-free, easily handled mineral acids or salts thereof and/or mixtures thereof, which can be in the form of a solution or paste.

If it is intended to apply the etching media over the entire surface, they can be applied by a method generally known to the person skilled in the art, such as, for example, spin-coating, spraying or dipping. In a second step, the phosphoric acid is excited to etch the silicon dioxide layer by local heating, for example with the aid of a laser. In a further step, the phosphoric acid can be heated locally to temperatures in the region >800° C., preferably to temperatures of about 900° C., as is necessary for n$^{++}$ doping, using a second, stronger laser. It is particularly favourable here to use an IR laser whose wavelength is not absorbed by the underlying silicon, in order to prevent crystal defects. By carrying out the process adroitly, the etching and doping process can in accordance with the invention be carried out in a single step. The surrounding silicon dioxide which has not been etched away advantageously acts as diffusion barrier during the doping operation and prevents the doping of the unetched regions.

However, selective coating of the silicon substrates with a paste-form mixture containing phosphoric acid appears more favourable than coating over the entire surface. This can be carried out by a printing method known to the person skilled in the art, such as, for example, by screen, stencil, stamp or pad printing. After the application, the substrates are warmed in a subsequent step in order to initiate the silicon dioxide etching. This can be carried out on a hotplate or by IR radiation or by another method of heating substrates which is known to the person skilled in the art (microwaves, convection oven). A temperature range from 350 to 400° C. is advantageous for the etching. The etching duration for a silicon dioxide layer having a thickness of 120 nm at 350° C. is about 60 seconds. The etching step can be followed immediately, in a next step, by heating of the substrate for 1 to 40 minutes at temperatures >800° C., as are necessary for thermal n$^{++}$ doping with phosphorus. The diffusion profile of the phosphorus into the silicon can be controlled via the duration and temperature in the manner known to the person skilled in the art.

By carrying out the process adroitly, the etching and doping here can be carried out immediately one after the other in a single process step.

Selective application is not only more favourable with respect to material consumption, but also the throughput of the substrates to be etched can take place considerably more quickly than is possible by serial writing of a surface using a laser.

In contrast to the above-mentioned printing methods, application by means of ink-jet printing—a non-contact method—should be mentioned as a further variant. A warmed substrate can be printed and etched directly. By carrying out the process adroitly, simultaneous etching and doping is also possible under these conditions.

If the etching media used are pastes, these can be applied either over the entire surface or selectively to the areas to be doped.

Since the etchant in the pastes simultaneously serves as doping element, it can also serve as doping source in the actual etching step as described above.

To this end, the solar cells are subjected to temperatures of 800-1050° C., during which the doping element present in the paste diffuses into the contact regions and dopes the latter. All other paste components are volatile at these temperatures and burn without residues.

The paste can thus be applied in a single process step to the desired regions of the surface to be etched. A technique with a high degree of automation which is particularly suitable for the transfer of the paste to the surface is printing. Screen, stencil, pad and stamp printing techniques, in particular, are methods known to the person skilled in the art for this purpose.

A particular advantage for use of the etching and doping media according to the invention is that all masking and lithography steps that are usually necessary for use of wet-chemical etching methods or for selective doping in the gas phase are superfluous, as are rinsing operations.

The etching pastes according to the invention have the following composition:
a. etching and optionally doping component
b. solvents
c. thickeners
d. optionally additives, such as antifoams, thixotropic agents, flow-control agents, deaerators, adhesion promoters The etching action of the proposed etching pastes is based on an acidic component which is active through temperature excitation. This component originates from the group of phosphoric acid (ortho-, meta- or pyro-) and salts thereof, preferably ammonium salts selected from the group $(NH_4)_2HPO_4$ and $NH_4H_2PO_4$.

The etching component is present in a concentration in the range 1-80% by weight, based on the total weight of the etching paste. The etch and removal rate of silicon dioxide can be considerably influenced by the concentration of the etching component.

It has been found in experiments that the etch rate of phosphoric acid can be increased further by the addition of a strongly oxidising component, such as, for example, nitric acid or nitrates. A component of this type can therefore optionally be added to the etching media according to the invention if it promotes the desired etching process.

The proportion of solvent can be in the range 20-80% by weight, based on the total weight of the etching paste. Suitable solvents can be pure inorganic or organic solvents or mixtures thereof, such as water, simple and/or polyhydric alcohols, ethers, in particular ethylene glycol monobutyl ether, triethylene glycol monomethyl ether, [2,2-butoxy (ethoxy)]-ethyl acetate.

The proportion of thickener necessary in order to set the viscosity range specifically and basically for printability of the etchant, i.e. for the formation of a printable paste, is in the range 1-20% by weight, based on the total weight of the etching paste.

Non-Newtonian behaviour of the etching pastes described is achieved by means of network-forming thickeners which have a swelling action in the liquid phase and can be varied depending on the desired area of application. Thickeners which can be used are organic or inorganic products or mixtures thereof:
- cellulose/cellulose derivatives, such as ethyl-, hydroxypropyl- or hydroxyethylcellulose or sodium carboxymethylcellulose
- starch/starch derivatives, such as sodium carboxymethyl-starch (Vivastar®), anionic heteropolysaccharides
- acrylates (Borchigel®)
- polymers, such as polyvinyl alcohols (Mowiol®), polyvinylpyrrolidones (PVP)
- highly disperse silicic acids, such as Aerosil®

With respect to the use of cellulose/cellulose derivatives, but also the other thickeners, it should be noted that it is only possible to employ derivatives which have sufficient adhesion to the substrate surface, at the same time prevent the spread of the etching medium and facilitate precise printing of extremely thin lines and structures. Thus, for example, it has been found that xanthan derivatives cannot be employed for the purpose according to the invention.

In contrast to organic thickeners, inorganic thickeners, such as, for example, highly disperse silicic acid, also remain on the substrate during the subsequent doping step at temperatures >800° C. and can thus be used to adjust the doping glass properties. Both types of thickener, organic and inorganic, can also be combined as desired with one another in the etching media, enabling different compositions to be selected depending on the application.

Additives having advantageous properties for the desired purpose are antifoams, thixotropic agents, flow-control agents/antiflow agents, deaerators and adhesion promoters. These can positively influence the printability of the etching paste.

In order to achieve high efficiencies in a solar cell, it is important that all starting materials for the preparation of the etching paste have sufficient purity. In particular, the readily diffusing elements, such as, for example, copper, iron and sodium, which considerably shorten the carrier lifetime in the silicon, should be present in concentrations <200 ppb.

In accordance with the invention, these novel etching and doping pastes can be employed in the solar cell industry for the production of photovoltaic elements such as solar cells or photodiodes. In particular, the pastes according to the invention can be employed in a two-step process for the production of emitter structures.

[1] W. Wettling, Phys. Bl. 12 (1997), pp. 1197-1202
[2] J. Horzel, J. Slufzik, J. Nijs, R. Mertens, Proc. 26th IEEE PVSC, (1997), pp. 139-42
[3] M. Schnell, R. Lüdemann, S. Schäfer, Proc. 16$^{th}$ EU PVSEC, (2000), pp. 1482-85
[4] D. S. Ruby, P. Yang, S. Zaidi, S. Brueck, M. Roy, S. Narayanan, Proc. 2$^{nd}$ World Conference and Exhibition on PVSEC, (1998), pp. 1460-63
[5] U.S. Pat. No. 6,091,021 (2000), D. S. Ruby, W. K. Schubert, J. M. Gee, S. H. Zaidi
[6] U.S. Pat. No. 5,871,591 (1999), D. S. Ruby, J. M. Gee, W. K. Schubert
[7] EP 0229915 (1986), M. Bock, K. Heymann, H.-J. Middeke, D. Tenbrink Even without further comments, it is assumed that a person skilled in the art will be able to utilise the above description in the broadest scope. The preferred embodiments and examples should therefore merely be regarded as descriptive disclosure which is absolutely not limiting in any way.

The complete disclosure content of all applications, patents and publications mentioned above and below, and of the corresponding application DE 10 2005 032 807.5, filed on Dec. 7, 2005, is incorporated into this application by way of reference.

For better understanding and for illustration, examples are given below which are within the scope of protection of the present invention, but are not suitable for restricting the invention to these examples.

EXAMPLE 1

Preparation and Composition of the Paste 6 g of Aerosil 200 (Degussa-Huels AG) were stirred into 100 g of 85% ortho-phosphoric acid (Merck Art. 1.00573) with stirring. The resultant paste was stirred using a paddle stirrer for a further 20 min.

EXAMPLE 2

Preparation and Composition of the Paste

3% by weight of PVP K90 were stirred into a mixture of 48.5% by weight of H$_3$PO$_4$ (85%) and 48.5% by weight of 1-methyl-2-pyrrolidone. The resultant paste was stirred using a paddle stirring for a further 20 min.

An etching paste prepared in the manner described is printed on a commercially available screen-printing machine using a type 120 T polyester screen. The layout shown in FIG. 1 is imaged on the screen and transferred onto the substrate. The substrate employed is a polycrystalline solar cell having a size of 100×100 mm$^2$ with a full-area silicon dioxide passivation layer. Immediately after printing, the substrate is heated on a hotplate at 300° C. for 100 seconds. Complete etching-through of the silicon dioxide layer is visually evident after only about 60 seconds. The substrate is then introduced into a diffusion oven containing atmospheric air at 850° C. for 30 min.

After removal of the phosphorus glass layer, the local, high doping with phosphorus in the region of about 10$^{20}$ cm$^{-3}$ can be determined by measurement of the electrical conductivity by means of a 4-point sample.

The invention claimed is:

1. A process for the etching of a passivation and/or antireflection layer of silicon dioxide on the surface of a solar cell, comprising applying in a single process step, an etching medium comprising phosphoric acid or a salt thereof over the entire surface of said solar cell or selectively to the surface regions to be etched
    wherein after said etching medium is applied, heating the entire surface or said selective surface regions to 350 to 400° C. for 30 to 120 seconds, and
    optionally, for additional n$^{++}$ doping, subsequently heating said entire surface or said selective surface regions to >800° C. for 1 to 60 minutes.

2. A process according to claim 1, wherein said medium is subsequently heated to 800 to 1050° C.

3. A process according to claim 1, wherein a paste-form etching medium is used.

4. A process according to claim 1, wherein the etching medium is applied by spraying, spin-coating, dipping or by screen, stencil, stamp, pad or ink-jet printing, depending on the consistency.

5. A process according to claim 1 wherein said etching medium is heated on a hotplate, in a convection oven, by IR radiation, UV radiation or microwaves.

6. A process according to claim 1, wherein a laser, is used for the local heating.

7. A process according to claim 1 for the production of solar cells with two-stage emitters.

8. An etching paste for the etching of inorganic passivation and/or antireflection layers on solar cells, comprising,
    (a) 1-80% by weight based on the total weight of the paste of an active component, that is:
        (i) ortho-, meta- or pyrophosphoric acid, and/or metaphosphorus pentoxide, or a mixture thereof, which acts both as etching and doping component or
        (ii) one or more ammonium salt(s) of phosphoric acid and/or mono- or diesters of a phosphoric acid, which liberates the etching phosphoric acid through temperature excitation,
    (b) 1-20% by weight based on the total weight of the paste of a solvent that is water, a simple or polyhydric alcohol, an ether, ethylene glycol monobutyl ether, triethylene glycol nonmethyl ether, [2,2-butoxy(ethoxy)]-ethyl acetate or a mixture thereof, and
    (c) 1-20% by weight based on the total weight of the paste of an inorganic and/or organic thickener.

9. An etching paste according to claim 8 comprising at least one etching and doping component, a solvent, a thickener and optionally an antifoamagent, a thixotropic agent, a flow-control agent, a deaerator or an adhesion promoter.

10. An etching paste according to claim 8 for the n$^{++}$ doping of silicon.

11. An etching paste according to claim 8 wherein said thickener is a cellulose, a cellulose derivative, ethyl-, hydroxypropyl- or hydroxyethylcellulose, sodium carboxymethylcellulose, a starch, a starch derivative, sodium carboxymethylstarch, an anionic heteropolysaccharide, an acrylate, a polyvinyl alcohol, polyvinylpyrrolidone (PVP); a highly disperse silicic acid or a mixture thereof.

12. An etching paste according to claim 8, wherein said etching paste further comprises nitric acid or a nitrate.

* * * * *